(12) United States Patent
Kireeff Covo

(10) Patent No.: US 8,481,961 B2
(45) Date of Patent: Jul. 9, 2013

(54) SHIELDED CAPACITIVE ELECTRODE

(75) Inventor: Michel Kireeff Covo, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 1186 days.

(21) Appl. No.: 12/368,541

(22) Filed: Feb. 10, 2009

(65) Prior Publication Data

US 2013/0068963 A1 Mar. 21, 2013

Related U.S. Application Data

(60) Provisional application No. 61/028,737, filed on Feb. 14, 2008.

(51) Int. Cl.
*G21K 5/00* (2006.01)

(52) U.S. Cl.
USPC .............. 250/397; 250/396 R; 250/492.1; 250/492.3

(58) Field of Classification Search
USPC .......... 250/492.1, 492.3, 423 R, 306, 307, 250/309, 310, 311, 396 R, 397, 398
See application file for complete search history.

(56) References Cited

U.S. PATENT DOCUMENTS

| | | | |
|---|---|---|---|
| 2003/0007310 A1* | 1/2003 | Trinh et al. | 361/302 |
| 2004/0018700 A1* | 1/2004 | Cowan et al. | 438/513 |
| 2004/0222389 A1* | 11/2004 | Swenson | 250/492.21 |
| 2008/0149826 A1* | 6/2008 | Renau et al. | 250/288 |

* cited by examiner

*Primary Examiner* — Nicole Ippolito
(74) *Attorney, Agent, or Firm* — Technology Transfer and Intellectual Property Management Department, Lawrence Berkeley National Laboratory

(57) ABSTRACT

A device is described, which is sensitive to electric fields, but is insensitive to stray electrons/ions and unlike a bare, exposed conductor, it measures capacitively coupled current while rejecting currents due to charged particle collected or emitted. A charged particle beam establishes an electric field inside the beam pipe. A grounded metallic box with an aperture is placed in a drift region near the beam tube radius. The produced electric field that crosses the aperture generates a fringe field that terminates in the back surface of the front of the box and induces an image charge. An electrode is placed inside the grounded box and near the aperture, where the fringe fields terminate, in order to couple with the beam. The electrode is negatively biased to suppress collection of electrons and is protected behind the front of the box, so the beam halo cannot directly hit the electrode and produce electrons. The measured signal shows the net potential (positive ion beam plus negative electrons) variation with time, as it shall be observed from the beam pipe wall.

17 Claims, 4 Drawing Sheets

LOWER VIEW FROM INSIDE THE BOX

UPPER VIEW

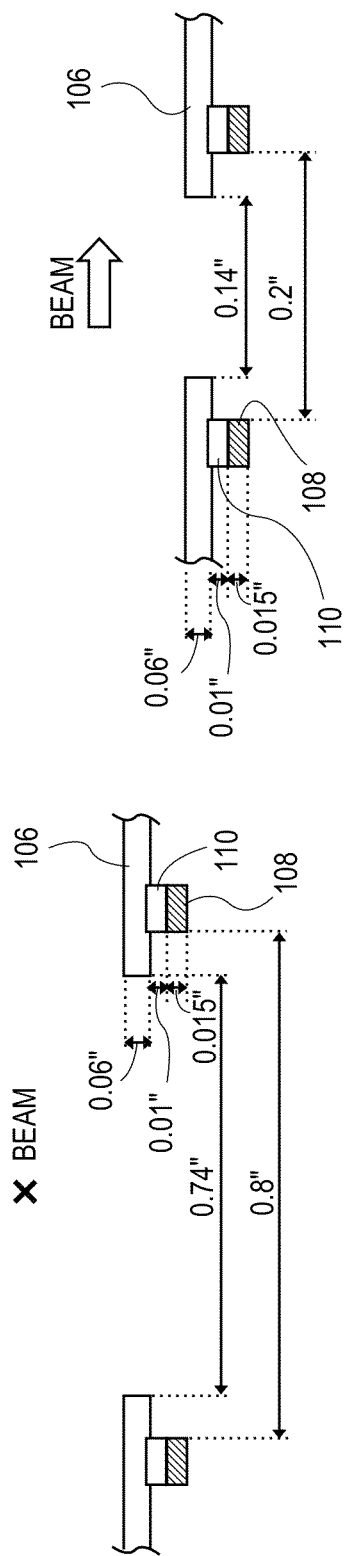

SHIELDED CAPACITIVE ELECTRODE

CROSS REFERENCE TO RELATED CASES

This application claims priority to U.S. Provisional Application Ser. No. 61/028,737, filed Feb. 14, 2008, and entitled "Shielded Capacitive Electrode", which provisional application is incorporated herein by reference as if fully set forth in its entirety.

STATEMENT OF GOVERNMENTAL SUPPORT

The invention described and claimed herein was made in part utilizing funds supplied by the U.S. Department of Energy under Contract No. DE-AC02-05CH11231. The government has certain rights in this invention.

BACKGROUND OF THE INVENTION

1. Field of the Invention

This invention relates generally to particle beams, and, more specifically to an improved sensor and method for monitoring particle beam potential.

2. Description of the Related Art

Ion beam accelerators have long been used to produce particle beams as a research tool for basic physical investigations of matter, for ion implantation in the semiconductor arts, cancer therapy, synchrotron radiation sources, transmutation of long lived nuclear waste, inertial fusion, food and medical sterilization, and condensed matter physics among other things. Typically these particle accelerators can be anywhere from 2-15 meters in length, or more, and are operated at potentials of tens to thousands Volts. Often times it is important to be able to accurately measure the potential of the particle beam from within the accelerator unit itself. Traditionally this has been done by placing an electrode inside of the accelerator beam tube in proximity to and capacitively coupled with the beam to measure the image charge (or integrated current) induced by the electric field. In a typical case such electrode sensors are placed near the beam but at sufficient distance away so as not to infringe upon the path of the beam.

One problem with the current approach is that the beam can interact with background gas and the walls of the accelerator and desorb electrons that can multiply and accumulate, creating an electron cloud. This ubiquitous effect grows at high current, energy and fill factor and degrades the quality of the beam. The electrons of this electron cloud are free to strike the sensor electrode and thus distort the readings of the sensor. Additionally, the beam halo striking the containment walls of the beam device and the sensor electrode itself may in turn produce additional electrons which can be pulled back into the particle beam. These processes ruin the measurements of the capacitive electrode. Accordingly, what is still needed is a means for measuring the beam potential in such systems which are not subject to nor affected by these influences.

BRIEF SUMMARY OF THE INVENTION

According to this invention, an improved sensor is provided in which a capacitively coupled electrode is positioned in proximity to a particle beam and the electrode is mechanically shielded from stray particles, such as found within the beam halo. In one embodiment a grounded metallic box having a face plate, including an aperture is placed in a drift region. The produced electric field that crosses the aperture generates a fringe field that terminates in the back surface of the face plate, inducing an image charge. An electrode placed inside the grounded box, and near the aperture where the fringe fields terminate, couples with the beam. The electrode is negatively biased so as to suppress collection of electrons and is protected by the face plate, so the beam halo (ubiquitous beam particles moving out of the beam core) cannot directly hit the electrode and produce electrons. The measured signal shows the net potential (positive ion beam plus negative electrons) variation with time. In one embodiment, the faceplate aperture is rectangular in shape, and has a length to width aspect ratio of about 2/1 to 5/1. These and other aspects of the improved sensor will now be described in connection with the attached drawings and the detailed description which follows.

BRIEF DESCRIPTION OF THE DRAWINGS

The foregoing aspects and others will be readily appreciated by the skilled artisan from the following description of illustrative embodiments when read in conjunction with the accompanying drawings.

FIG. 3A is a partial view of the side of the face plate of FIG. 2 in the axial beam direction, and FIG. 3B is a partial view of side of the face plate of FIG. 2 in the transverse direction to the beam, both figures depicting details regarding the positioning of the shielded electrode.

DETAILED DESCRIPTION

By way of this invention an improved beam sensor has been developed for measuring the potential of a particle beam; the sensor comprising a shielded capacitively electrode (SCE), mounted inside a grounded box, which is positioned in the halo portion of the beam to be measured. The details of the construction of the sensor are presented below. It should be appreciated that reference to sensor dimensions are for illustrative purposes only, and are not to be taken as limitations regarding the invention itself.

The sensor 100 includes in the first instance box 101. The box may be made of any conductive metal, and in one embodiment is made of stainless steel. Box size is not critical, but it must be small enough to be placed inside the beam line tunnel (i.e. the beam pipe) containing beam 102 which will be measured. It must also be deep enough so as not to interfere with either the electric field lines induced by the beam potential or become a significant source of secondary electrons, which will change the net (ions and electrons) potential and affect the readings taken by the SCE.

Figure 1:
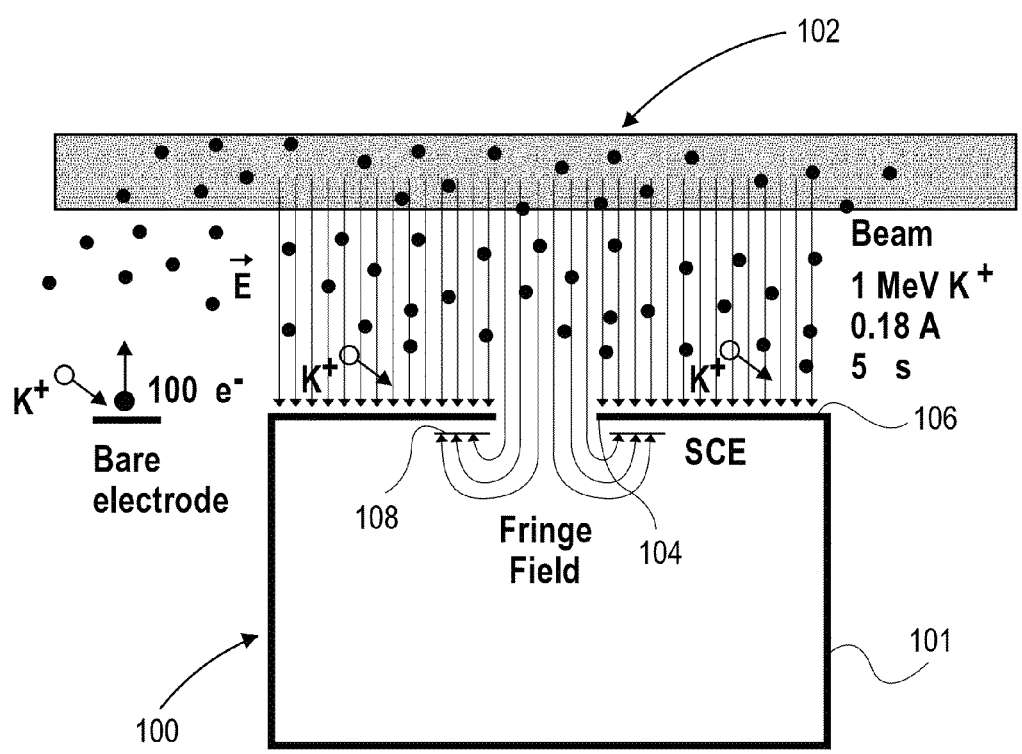
FIG. 1 is a schematic view of the shielded capacitive electrode sensor of this invention shown in proximity to a beam to be measured. The beam core is represented as a shaded strip, the beam halo represented by larger white dots, the electron cloud smaller dark dots, and the shielded capacitive electrode is designated by the letters SCE.
Figure 4:
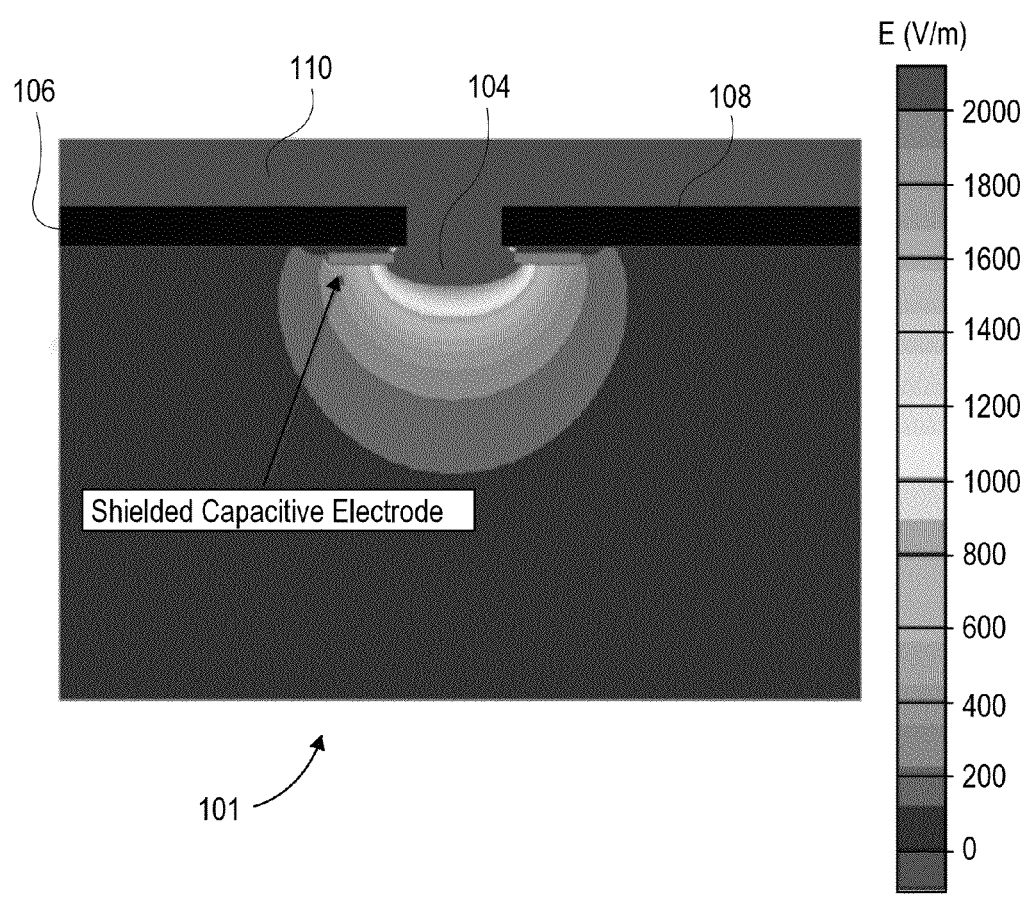
FIG. 4 is a depiction of a simulation illustrating the bending of the fringe field as it passes through the aperture of the face plate of FIGS. 2 and 3.

An opening/aperture 104 is provided in face plate 106 of sensor box 101, positioned to face beam 102. In one embodiment, opening 104 comprises a slit having a length to width aspect ratio of between 2/1 and 5/1, or higher. The axial length should be large enough to increase the signal strength without allowing stray particles from reaching the electrode, which will desorb electrons. It has been found that the fringe fields crossing the aperture actually bend around the aperture as shown in the FIG. 1 to capacitively couple with the capacitive electrode 108 mounted to the rear wall of faceplate 106. This bending of the field is also illustrated in the simulation of FIG. 4, the electric field crossing the aperture of the faceplate to reach the SCE, and diminishing in intensity with distance from opening 104.

While the illustrated opening is rectangular in shape, it is to be appreciated that it could be of other configuration such as a square, oval, circle, etc. More important than its specific shape or size is its ability to enhance the electric flux induced by the beam potential as it extends into the sensor box and bends around the opening to couple to electrode 108.

Figure 2B:
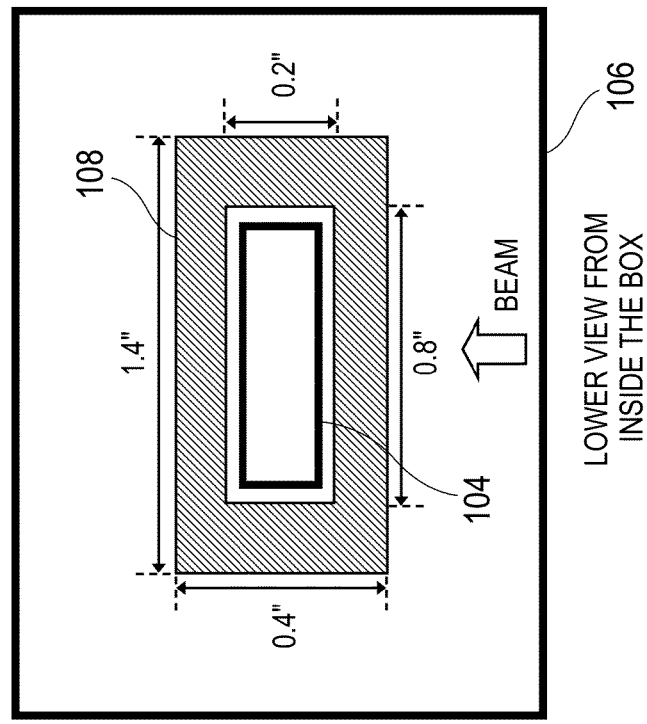
FIG. 2B is a view of the face plate of FIG. 2A as seen from the back, on the side shielded from the beam.
Figure 2A:
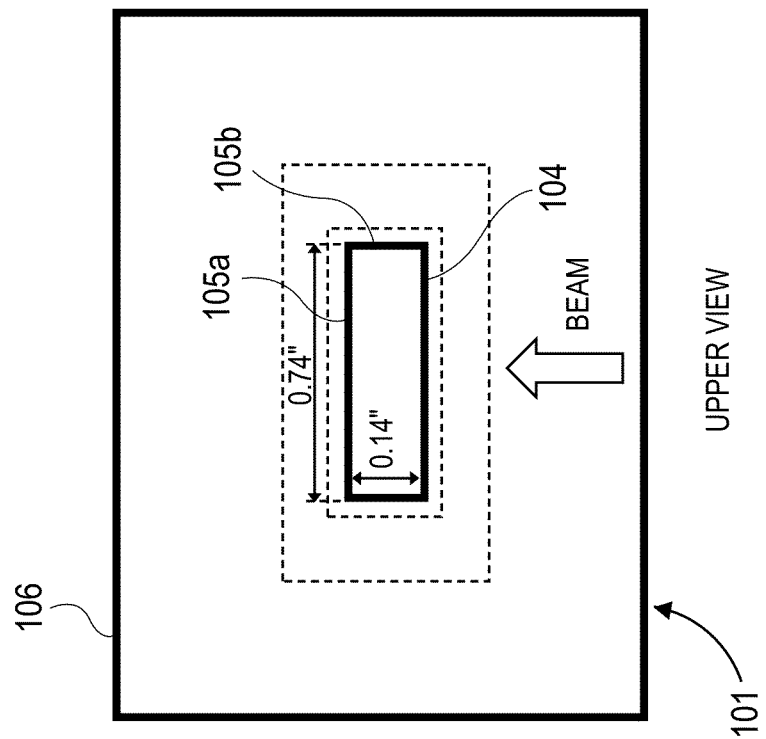
FIG. 2A is the view of the front face plate of the sensor of this invention.

With reference now to FIG. 2A, beam 102 is shown passing in front of sensor 101 and face plate 106, the sensor oriented so that the long side 105a of slit 104 is oriented perpendicular to the path of beam travel to enhance the signal strength at the same time that it avoids stray particles that mainly move in the direction of the beam from reaching the electrode. As illustrated in FIG. 2A, the aspect ratio is approximately 5/1. In FIG. 2B the face plate is seen from the back, with electrode 108 concentrically disposed about aperture 104. Electrode 108 may be fabricated from any conductive metal, such as stainless steel. Electrode 108 in the embodiment illustrated is of the same rectangular shape as the aperture, and is spaced a distance from front plate 106 by an insulating layer 110, which in one embodiment is an insulating plastic such as a polyimide plastic. In another embodiment the insulating plastic is Kapton.

Preferably, the electrode is held at a negative potential relative to the beam to repel any electrons that either enter the sensor or are generated by beam interactions with the inside walls of the sensor. In one embodiment a potential of between −20 and −200 volts or more may be applied to the electrode. The box 101 is typically maintained at ground, and is connected to a linear feed-through that allows positioning of the aperture relative to the beam.

The sensor may be positioned anywhere along the beam path, including in apertures made on the beam pipe, preferably in regions of easy access, such as drift region between magnets. Typically, the drift region of the particle beam accelerator can contain a chamber of a larger diameter than the accelerator beam pipe. Accordingly, when the sensor of the invention is inserted along a section of the drift region, the distance of the sensor face from the beam pipe's axis is adjusted to match the radius of the beam pipe. Thus, in this way, one is able to effectively measure the beam potential at the beam pipe wall. Alternatively, the sensor can be inserted around an orifice made at the beam pipe itself, the face of the sensor placed flush to the outer side of the beam pipe wall.

It is also important for accuracy of measurement that ions from the beam not reach the shielded electrode. For this reason, electrode 108 is recessed a distance away from the opening as shown in FIGS. 2 and 3 to reduce the possibility of collisions with beam ions. The degree of recess is not critical and can be determined by trial and error or from measurements from the beam halo dynamics. On one hand the greater the recess distance, the less the likelihood of a collision by stray particles. On the other hand, the wider the recess the weaker the electric field will be that is seen by the electrode (as evidenced by the simulation of FIG. 4), as the strength of the fringe field decreases with distance away from the opening.

The distance the sensor is placed from the beam is not critical, but it should be positioned within the outer boundary of the beam halo. Notably because the capacitive electrode is largely shielded from the beam halo (as opposed to a bare electrode placed in direct communication with said halo), it is only weakly coupled with the beam. In fact, it has been found that the signal measured with the SCE is attenuated as much as by 24 times, or more as compared with an electrode directly coupled to the beam. Thus, a current amplifier reading the charge arriving or leaving the electrode produces an amplified signal that is proportional to the net charge (positive beam plus negative electrons) as seen from the walls of the beam pipe.

EXAMPLE

A sensor according to the invention is constructed using an SCE made from a 1.4" by 0.4" stainless steel frame with a central hole of 0.8" by 0.2". It is placed inside a grounded box that has an aperture of 0.74" by 0.14". The frame hole is concentrically aligned to the aperture and recessed 0.03" from the front aperture border, providing a mechanical shield of the SCE electron from expelled ions and halo loss. A Kapton frame 0.01" thick is placed between the SCE and the front face plate to assure a bias insulation of at least −300V.

The dimensions as shown in the figures and discussed in the Example are illustrative of the functional dimensions that were employed in the construction of a sensor according the instant invention. The providing of these dimensions is not intended to be limiting but is merely indicative to show relative proportions among the various components of the sensor.

The sensor is placed inside a beam source which delivers a 1 MeV $K^+$ ion beam current of 180 mA inside a beam pipe (flight tube) having a radius of approximately 4 cm, the duration of the beam pulse being 5 µs, which corresponds to a beam line charge density of $8.18 \times 10^{-8}$ C/m. The box is oriented such that the beam passes parallel to the minor side of the aperture in order to minimize the probability of beam halo entering the box, and is positioned along a drift section of the beam path at a distance 4 cm from the center of the beam pipe. If the SCE electrode was directly coupled to the beam, it would produce an image charge of 32.5 pC during the 5 µs pulse. Placed inside the grounded box, the aperture attenuates the electrical field by a factor of 27 (as simulated in FIG. 4), so that the image charge of 1.2 pC is induced in the SEC electrode. This can be measured by connecting the SCE to a charge sensitive preamplifier such as CR-110 provided by Cremat, Inc. with a gain of −1.4 V/pC, which gives an output voltage of −1.67 V, large enough to be readily and accurately measured.

As has been described above, the SCE may be used to measure the net potential (positive ion beam plus negative electrons) of a beam, even in systems heavily contaminated with electron clouds. The SCE of this invention may also find application in the measurement of edge plasma potential in plasma processing or magnetic fusion, and in yet another application may find utility in sensing corona discharge in transmission lines, such as for example high voltage electric utility transmission lines. Additionally it may have application in the monitoring of ion beams used in the fabrication of semiconductor chips.

This invention has been described herein in considerable detail to provide those skilled in the art with information relevant to apply the novel principles and to construct and use such specialized components as required. However, it is to be understood that the invention can be carried out by different equipment, materials and devices, and that various modifications, both to the equipment and operating procedures, can be accomplished without departing from the scope of the invention itself.

I claim:

1. A sensor for the measurement of a potential of an ion beam including:
   a faceplate having a front wall and back wall, the faceplate defining an aperture; and
   an electrode mounted to the back wall of the faceplate, concentric to the aperture defined by the faceplate, wherein the electrode is configured to capacitively couple to fringe fields associated with the ion beam.

2. The sensor of claim 1 wherein the sensor includes a box, and wherein the faceplate comprises a side of the box.

3. The sensor of claim 1 wherein the faceplate is configured to be grounded.

4. The sensor of claim 1 wherein the aperture of the sensor is in the form of a rectangle.

5. The sensor of claim 4 wherein the width-to-length aspect ratio of the rectangle is about 2/1 to 5/1.

6. The sensor of claim 4 wherein the electrode is in the form of a rectangle, and defines a central opening at least as large as the aperture defined by the faceplate.

7. The sensor of claim 6 wherein the electrode is is positioned a distance from the back wall of the faceplate.

8. The sensor of claim 1 wherein the electrode is mounted to an insulating layer, and wherein the insulating layer is mounted to the back wall of the faceplate.

9. The sensor of claim 8 wherein the insulating layer is an insulating plastic.

10. The sensor of claim 1 wherein the electrode is configured to be maintained at a negative potential.

11. A method for determining a potential of an ion beam, including:
    generating an ion beam;
    positioning a sensor in the vicinity of the ion beam, the sensor including:
      a faceplate having a front wall and back wall, the faceplate defining an aperture;
      an electrode mounted to the back wall of the faceplate concentric to the aperture defined by the faceplate, wherein the electrode is configured to capacitively couple to fringe fields associated with the ion beam; and
    measuring the charge induced in the electrode.

12. The method of claim 11 wherein the sensor is positioned within a halo portion of the ion beam.

13. The method of claim 11 wherein the electrode of the sensor is maintained at a negative potential relative to ground.

14. The method of claim 11 wherein the faceplate of the sensor is maintained at ground potential and the electrode of the sensor is maintained at a negative potential.

15. The method of claim 11 wherein the sensor is positioned relative to the ion beam such that the ion beam crosses the aperture defined by the faceplate in a direction parallel to its shortest dimension.

16. The method of claim 11 wherein the sensor is positioned along a drift section of a beam line apparatus used to transport the ion beam.

17. The method of claim 16 wherein the beam line apparatus includes a beam pipe through which the beam is transported, and wherein the faceplate of the sensor is radially positioned from the center of an axis of the beam pipe at a distance equal to a beam pipe radius of the beam pipe.

* * * * *